United States Patent
Yen et al.

(10) Patent No.: US 12,495,576 B2
(45) Date of Patent: Dec. 9, 2025

(54) SILICON CARBIDE SEMICONDUCTOR DEVICE

(71) Applicant: Fast SiC Semiconductor Incorporated, Hsinchu (TW)

(72) Inventors: Cheng-Tyng Yen, Hsinchu (TW);
Hsiang-Ting Hung, Hsinchu (TW);
Fu-Jen Hsu, Hsinchu (TW)

(73) Assignee: FAST SIC SEMICONDUCTOR INCORPORATED, Hsinchu (TW)

( * ) Notice: Subject to any disclaimer, the term of this patent is extended or adjusted under 35 U.S.C. 154(b) by 458 days.

(21) Appl. No.: 18/155,524

(22) Filed: Jan. 17, 2023

(65) Prior Publication Data

US 2023/0361209 A1    Nov. 9, 2023

Related U.S. Application Data

(60) Provisional application No. 63/337,650, filed on May 3, 2022.

(51) Int. Cl.
*H01L 29/78* (2006.01)
*H10D 30/66* (2025.01)
*H10D 62/10* (2025.01)
*H10D 62/17* (2025.01)
*H10D 62/832* (2025.01)

(52) U.S. Cl.
CPC ........... *H10D 30/66* (2025.01); *H10D 62/109* (2025.01); *H10D 62/393* (2025.01); *H10D 62/8325* (2025.01)

(58) Field of Classification Search
None
See application file for complete search history.

(56) References Cited

U.S. PATENT DOCUMENTS

| | | | |
|---|---|---|---|
| 7,071,518 B2 * | 7/2006 | Parthasarathy | H10D 8/00 257/E27.033 |
| 7,671,409 B2 | 3/2010 | Kitabatake et al. | |
| 8,492,827 B2 | 7/2013 | Ryu | |
| 2022/0115536 A1 * | 4/2022 | Chen | A61M 25/003 |

FOREIGN PATENT DOCUMENTS

CN    108461545 A  *  8/2018  ......... H10D 62/8325

* cited by examiner

*Primary Examiner* — William C Trapanese
(74) *Attorney, Agent, or Firm* — MUNCY, GEISSLER, OLDS & LOWE, P.C.

(57) ABSTRACT

A silicon carbide semiconductor device comprises a drift layer, a plurality of transistor cells and a gate structure. Each of the transistor cells comprises a first doped region, a second doped region, a third doped region and a fourth doped region. The first doped region is disposed in the drift layer. The second doped region is disposed in the first doped region. The third doped region is disposed in the first doped region and adjacent to the second doped region. The fourth doped region is disposed in or on the first doped region to form a channel region and is configured in a way such that the channel region is not fully depleted when a driving gate voltage applied to the semiconductor device is zero and the channel region is fully depleted when the driving gate voltage is less than a negative threshold voltage.

12 Claims, 4 Drawing Sheets

SILICON CARBIDE SEMICONDUCTOR DEVICE

CROSS REFERENCE TO RELATED APPLICATIONS

This application claims priority of U.S. Provisional Application No. 63/337,650 filed on May 3, 2022 under 35 U.S.C. § 119 (e), the entire contents of all of which are hereby incorporated by reference.

FIELD OF THE INVENTION

The present disclosure relates to a silicon carbide semiconductor device and more particularly to a depletion mode N-channel silicon carbide power MOSFET.

BACKGROUND OF THE INVENTION

More recently, silicon carbide (SiC) power devices have emerged as a promising material for power transistors in power conversion applications. Power transistors include metal-oxide-semiconductor field effect transistors (MOSFET), insulated gate bipolar transistors (IGBT), heterostructure field effect transistors (HFET), junction field effect transistors (JFET) and high electron mobility transistors (HEMT). SiC power transistors such as SiC MOSFETs have the advantages of high input impedance, lower driving loss, lower on-resistance, high blocking voltage, lower switching loss, faster switching speed, and larger safe operating area compared to their silicon counterparts.

Power MOSFET is a gate-controlled power switch. The majority of power MOSFETs are N-channel enhancement-mode MOSFETs, where electron serves as the conducting carrier of electric current. If a voltage is applied between the gate and source terminals of a MO SFET is high enough, the electric field across the gate oxide induces an inversion layer in the p-well region of the MOSFET which serves as a conducting channel allowing electric current to flow between the source and the drain terminals. If the applied gate voltage is zero, the inversion layer is absent and the channel is turned-off, then the MOSFET is at its off-state and is capable of blocking a certain voltage applied between the drain and source terminals and behaves as a normally-off device. In some applications, such as solid state relays, a normally-on device, which conducts current when zero gate voltage is applied to the device, is desired to simplify the system design and improve performance. Junction field effect transistor (JFET) is the most common normally-on silicon carbide power device, however, the gate structure of SiC JFET is a PN diode, which becomes forward biased when the applied gate voltage is positive, and induces significant gate leakage current when the applied gate voltage is higher than 2V.

SUMMARY OF THE INVENTION

A silicon carbide semiconductor device according to an embodiment of the present invention comprises: a drift layer, disposed on a SiC substrate, the drift layer having a first conductivity type and an upper surface; and a plurality of transistor cells, comprising: a first doped region, disposed in the drift layer and adjoining the upper surface, the first doped region having a second conductivity type opposite the first conductivity type; a second doped region, disposed in the first doped region, the second doped region having the first conductivity type; a third doped region, disposed in the first doped region and adjacent to the second doped region, the third doped region having the second conductivity type; a gate structure, arranged on top of the channel region, the gate structure including a gate insulator and a gate electrode contacting the gate insulator; a fourth doped region, disposed in or on the first doped region to form a channel region, the fourth doped region having the first conductivity type such that a threshold voltage of the semiconductor device is negative and the semiconductor device is capable of conducting current when a gate voltage (Vgs) applied to the semiconductor device is equal to or higher than zero and the semiconductor device is incapable of conducting current when the gate voltage (Vgs) is lower than the threshold voltage.

DETAILED DESCRIPTION OF THE PREFERRED EMBODIMENTS

Figure 1:
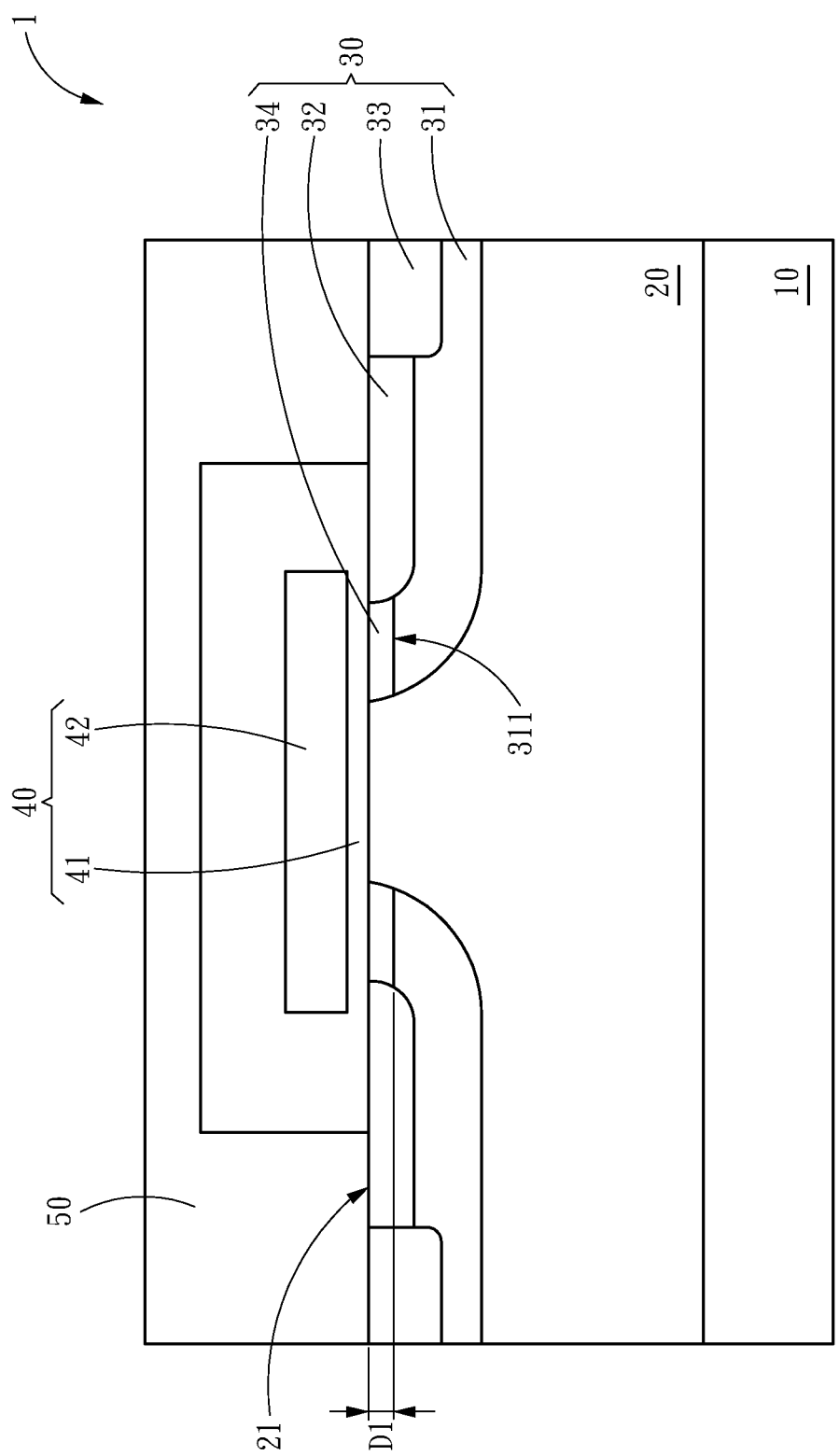
FIG. 1 shows a schematic plan view of a silicon carbide semiconductor device according to a first embodiment of the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "and/or" includes any and all combinations of one or more of the associated listed items.

In the drawings, the thickness of layers and regions are exaggerated for clarity. It will also be understood that when an element such as a layer, portion, region, or substrate is referred to as being "on", "overlie" or "atop" another element, it can be directly on, directly overlie or directly atop the other element or intervening elements may also be present. In contrast, when an element is referred to as being "directly on", "directly overlie" or "directly atop" another element, there are no intervening elements present.

Relative terms such as "below", "above", "upper", "lower", "horizontal", or "vertical" may be used herein to describe a relationship of one element, layer, portion, or region to another element, layer, portion, or region as illustrated in the figures. It will be understood that these terms and those discussed above are intended to encompass different orientations of the device in addition to the orientation depicted in the figures. A number of embodiments will be explained below, identical structural features are identified by identical or similar reference symbols in the figures. As used herein, "lateral" or "lateral direction" should be understood to mean a direction or extent that runs generally parallel to the lateral extent of the semiconductor device. The lateral direction thus extends generally parallel to its surfaces or sides. In contrast thereto, the term "thickness direction" is understood to mean a direction that runs generally perpendicular to its surfaces or sides and thus to the lateral direction.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

The terms "first conductivity type" and "second conductivity type" refer to opposite conductivity types such as N-type or P-type, however, each embodiment described and illustrated herein includes its complementary embodiment as well. Like numbers refer to like elements throughout.

FIG. 1 shows a cross-sectional view of a silicon carbide semiconductor device 100 according to a first embodiment of the present disclosure. This is a schematic representation, only partially illustrating structure of the silicon carbide semiconductor device 1. The device 1 in the following embodiment is a normally-on, depletion mode N-channel SiC MOSFET, which is forced to turn off when a negative Vgs is applied, i.e., the threshold voltage of semiconductor device 1 is negative. For example, the threshold voltage is lower than −1 V (minus one volt). The semiconductor device 1 includes a SiC substrate 10, a drift layer 20, a plurality of transistor cells 30, a gate structure 40 and a metal layer 50.

The SiC substrate 10 has a first conductivity type (e.g., n-type). The drift layer 20 is disposed on the substrate 10 and may have the first conductivity type. The transistor cells 30 are formed in the drift layer 20. Each of the transistor cells 30 includes a first doped region 31, a second doped region 32, a third doped region 33, and a fourth doped region 34.

The transistor cells 30 are disposed substantially evenly and substantially uniformly at an upper surface 21 of the drift layer 20. In one preferred embodiment, the transistor cell 30 is configured to form a MOSFET device.

The first doped region 31 is disposed in the drift layer 20 and adjoining the upper surface 21 of the drift layer 20. The first doped region 31 has a second conductivity type (e.g., p-type), which is opposite the first conductivity type. The second doped region 32 is disposed in the first doped region 31, which has the first conductivity type. The first doped region 31 includes a top portion 311 that is in proximity to the upper surface 21. The top portion 311 is sandwiched between the drift layer 20 and the second doped region 32.

The third doped region 33 is disposed in the first doped region 31, adjacent to the second doped region 32 and has the second conductivity type. The fourth doped region 34 is disposed in or on the first doped region 31 to form a channel region and has the first conductivity type with a concentration of higher than 1E16 cm^−3. In a non-limiting exemplary embodiment, the fourth doped region 34 may be formed by implanting into the first doped region such that the fourth doped region 34 is disposed in the first doped region 31. Alternatively, the fourth doped region 34 may be formed by epitaxial growth on the first doped region such that the fourth doped region 34 is disposed on the first doped region 31. In detail, the fourth doped region 34 is a thin layer formed on the top portion 311 of the first doped region 31 and forms a PN junction with the first doped region 31. In a non-limiting exemplary embodiment, the fourth doped region 34 is formed from the upper surface 21 of the drift layer 20 along a thickness direction to a depth D1 of less than 0.5 μm in and preferably less than 0.2 μm.

The gate structure 40 overlies the upper surface 21 of the drift layer 20 and is disposed over top of the channel region, the gate structure 40 includes a gate insulator 41 and a gate electrode 42 contacting the gate insulator 41 and connecting to a gate terminal of the MOSFET. A metal layer 50 is contacting with the second doped region 32 and the third doped region 33 and is connecting to a source terminal. A drain terminal is arranged to a bottom surface of the SiC substrate 10. The fourth doped region 34 is not fully depleted when a gate voltage (Vgs) of 0 V is applied between the gate terminal and the source terminal, and is able to conduct current when Vgs is equal to or greater than 0 V. When the gate voltage (Vgs) is lower than a negative threshold voltage (Vth), for example, Vgs=−5 V and Vth=−3 V, the fourth doped region 34 becomes fully depleted and the conducting channel between the source terminal and the drain terminal of the MOSFET is pinched off, and the MOSFET is able to withstand a blocking voltage (Vds) applied between the drain terminal and source terminal.

Figure 2:
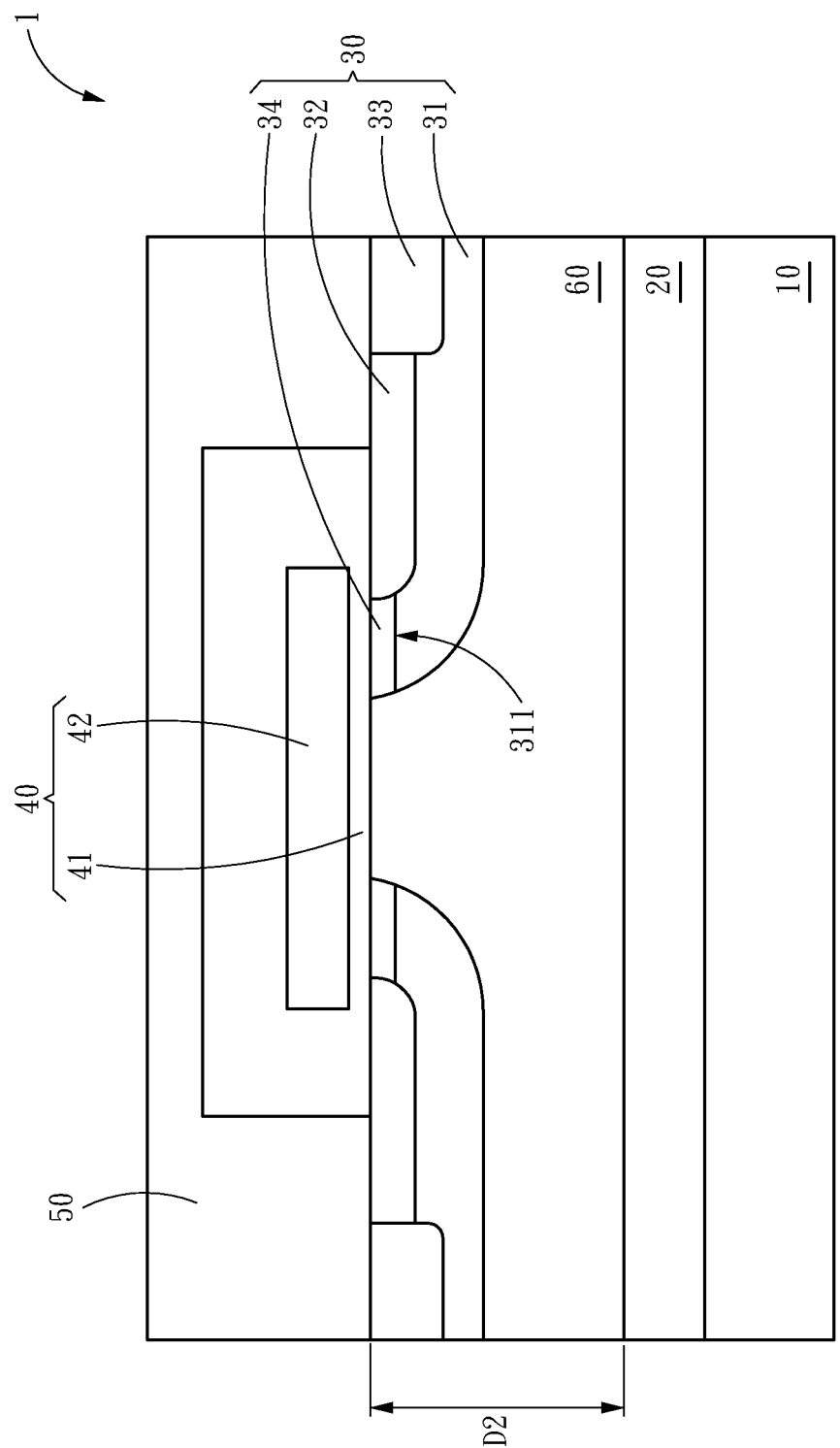
FIG. 2 shows a cross-sectional view of the silicon carbide semiconductor device according to a first embodiment of the present disclosure.

In another embodiment of FIG. 2, a fifth doped region 60 of the first conductivity (n-type) is provided in an upper portion 22 of the drift layer 20, a doping concentration of the fifth doped region 60 is higher than the doping concentration of the drift layer 20. The first doped region 31, the second doped region 32, the third doped region 33 and the fourth doped region 34 are disposed in the fifth doped region 60 of each of the transistor cells 30. In one embodiment, the fifth doped region 60 is formed from the upper surface 21 of the drift layer 20 along a thickness direction to a depth D2. The depth D2 is equal to or greater than a junction depth of the first doped region 31. In an embodiment, the depth D2 is less than 2 μm. In one exemplary embodiment, the doping concentration of the drift layer 20 is 1E16 cm^−3, the doping concentration of the fifth doped region 60 is 5E16 cm^−3, and the doping concentration of the fourth doped region 34 is 1E17 cm^−3. The depth D1 of the fourth doped region 34 is 0.1 μm, the depth D2 of the fifth doped region 60 is 1 μm, and a thickness of the drift layer 20 is 5 μm. In yet another embodiment, the doping concentration of the drift layer 20 is 8E15 cm^−3, the doping concentration of the fifth doped region 60 is 2E16 cm^−3 and the doping concentration of the fourth doped region 34 is 2E17 cm^−3. The depth D1 of the fourth doped region 34 is 50 nm, the depth D2 of the fifth doped region 60 is 0.8 μm, and a thickness of the drift layer 20 is 10 μm. The doping concentrations and thicknesses of the drift layer 20, the fourth doped region and the fifth doped region can be adjusted and optimized for the required blocking voltage and threshold voltages Vth.

In an embodiment, the semiconductor device may have a blocking voltage higher than 300 V when the applied gate voltage is lower than the threshold voltage. In one embodiment, the semiconductor device may have an active area specific on-resistance lower than 6 mOhm·cm^2 when the applied gate voltage is equal to or higher than zero volt. In an additional embodiment, the semiconductor device may have an active area specific on-resistance higher than 600 V when the applied gate voltage is lower than the threshold voltage, and lower than 2 mOhm·cm^2 when the applied gate voltage is equal to or higher than zero volt (0V). In yet another embodiment, the semiconductor device may have an active area specific on-resistance higher than 600 V when the applied gate voltage is lower than −2 V, and lower than 1.5 mOhm·cm^2 when the applied gate voltage is equal to or higher than 3 V.

Figure 3:
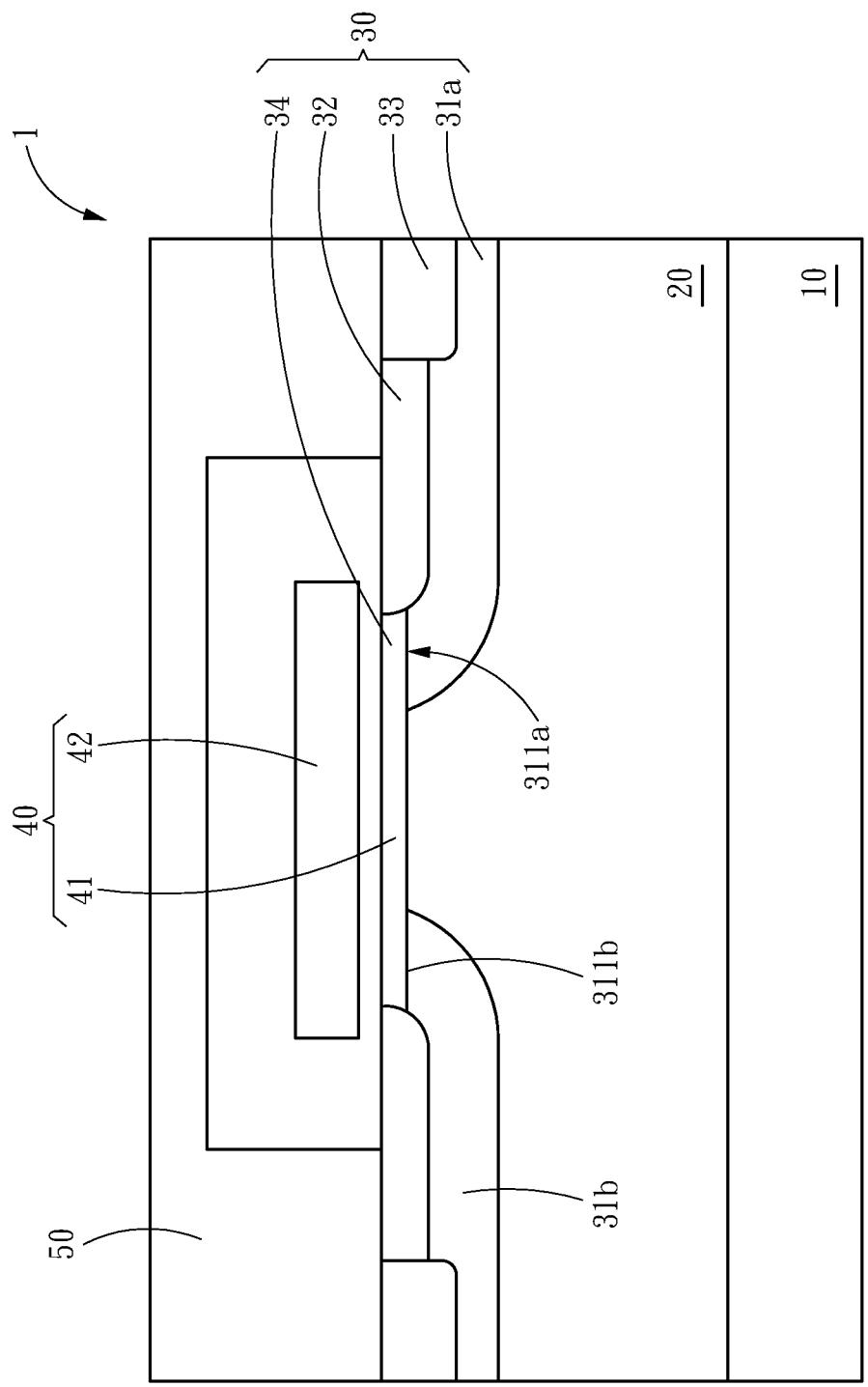
FIG. 3 shows a cross-sectional view of the silicon carbide semiconductor device according to a second embodiment of the present disclosure.

In yet another embodiment of FIG. 3, the fourth doped region 34 is laterally extended from a top portion 311a of the first doped region 31a through the drift layer 20 to the top portion 311b of the adjacent first doped region 31b.

As described below in more detail, the channel region formed by the fourth doped region 34 is n-type doped due to formation of the fourth doped region 34. In a non-limiting exemplary embodiment, the fourth doped region 34 is formed by an epitaxy process or an ion implantation process such that the doping concentration is high enough that the desired depletion mode SiC MOSFET is attained. In addition, a thickness of the fourth doped region 34 may be required to produce depletion mode behavior. The implementation of depletion mode behavior maybe complex, depends on fabrication processes and transistor cell designs. However, those skilled in the arts shall understand from the teachings herein that adjustment of one or more of the following provides an overall effect: the doping concentration of the fourth doped region 34, the epitaxy thickness of the fourth doped region 34 or the implantation energies used to form the fourth doped region 34, the activation annealing temperature, the thickness of the gate insulator and the designed channel length and so on.

As a result of being depletion mode SiC MOSFET, the channel region will not be fully depleted under operation condition of an on-state at which a driving gate voltage (Vgs) applied to the semiconductor device is zero, which results in conduction of current through the channel region. In contrast, conduction of current in the channel region will be cut-off in an off-state when the channel region is fully depleted to pinch-off the conducting path of current if the driving gate voltage is provided at a certain negative voltage (less than a threshold voltage). In a non-limiting exemplary embodiment, the threshold voltage (Vth) maybe −8 V. When the driving gate voltage (Vgs) is −10 V, the depletion mode SiC MOSFET will be turned off. In addition to the doping concentration and thickness of the fourth doped region 34, the threshold voltage (Vth) of the device can also be adjusted by adjusting the thickness of the gate insulator. For example, if in one embodiment, a thickness of the gate insulator is 50 nm and a threshold voltage (Vth) of −6 V can be implemented. In another embodiment, a thickness of the insulator is 60 nm and a threshold voltage (Vth) of −8 V can be implemented.

Figure 4:
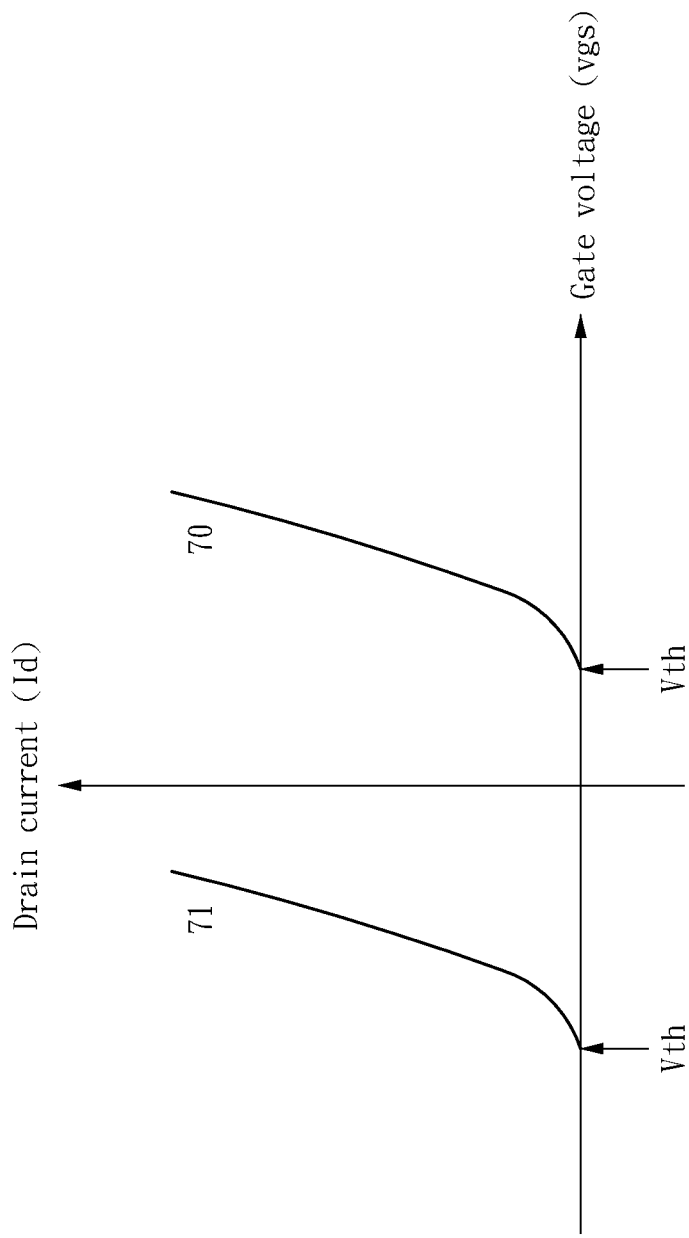
FIG. 4 is an example of the I-V characteristic in accordance with one embodiment of the present disclosure.

As can be seen from FIG. 4, curve 70 represents the transfer characteristic (Id-Vgs, drain current vs. gate voltage) curve of a typical enhancement mode SiC MOSFET and curve 71 represents the transfer characteristic the depletion mode SiC MOSFET according to an embodiment of the present invention. Compared to the typical enhancement mode SiC MOSFET, the threshold voltage (Vth) of the depletion mode SiC MOSFET is shifted to negative side of the x-coordinate and thereby exhibits a normally-on behavior.

What is claimed is:

1. A silicon carbide semiconductor device, comprising:
    a drift layer, disposed on a SiC substrate, the drift layer having a first conductivity type and an upper surface; and
    a plurality of transistor cells, comprising:
        a first doped region, disposed in the drift layer and adjoining the upper surface, the first doped region having a second conductivity type opposite the first conductivity type;
        a second doped region, disposed in the first doped region, the second doped region having the first conductivity type;
        a third doped region, disposed in the first doped region and adjacent to the second doped region, the third doped region having the second conductivity type;
        a gate structure, arranged on top of a channel region, the gate structure including a gate insulator and a gate electrode contacting the gate insulator; and
        a fourth doped region, disposed in or on the first doped region to form the channel region, the fourth doped region having the first conductivity type such that a threshold voltage of the semiconductor device is negative and the semiconductor device is capable of conducting current when a gate voltage applied to the semiconductor device is equal to or higher than zero and the semiconductor device is incapable of conducting current when the gate voltage is lower than the threshold voltage; and
        a fifth doped region, disposed in or on an upper portion of the drift layer, wherein the first doped region, the second doped region and the third doped region of each of the transistor cells are disposed in the fifth doped region.

2. The semiconductor device of claim 1, wherein the fourth doped region is formed from the upper surface of the drift layer along a thickness direction to a depth of less than 0.5 μm.

3. The semiconductor device of claim 1, wherein the fourth doped region has a doping concentration higher than 1E16 cm^−3, and preferably has a doping concentration higher than 2E16 cm^−3.

4. The semiconductor device of claim 1, wherein the gate insulator has a thickness of higher than 10 nm, and preferably has a thickness higher than 50 nm.

5. The semiconductor device of claim 1, wherein the fifth doped region is formed from the upper surface of the drift layer along a thickness direction to a depth of less than 2 μm.

6. The semiconductor device of claim 1, wherein the fourth doped region is laterally extended over the drift layer between the adjacent first doped regions.

7. The semiconductor device of claim 1, wherein the silicon carbide semiconductor device is a depletion mode SiC MOSFET.

8. The semiconductor device of claim 1, wherein the threshold voltage is lower than −1 V.

9. The semiconductor device of claim 1, wherein a blocking voltage of the semiconductor device is higher than 300V when the applied gate voltage is lower than the threshold voltage.

10. The semiconductor device of claim 1, wherein an active area specific on-resistance of the semiconductor device is lower than 6 mOhm·cm^−2 when the applied gate voltage is equal to or higher than zero volt.

11. The semiconductor device of claim 1, wherein a blocking voltage of the semiconductor device is higher than 600 V when the applied gate voltage is lower than the threshold voltage and an active area specific on-resistance of the semiconductor device is lower than 2 mOhm·cm^2 when the applied gate voltage is equal to or higher than zero.

12. The semiconductor device of claim 1, wherein a blocking voltage of the semiconductor device is higher than 600 V when the applied gate voltage is lower than −2 V and an active area specific on-resistance of the semiconductor device is lower than 1.5 mOhm·cm^2 when the applied gate voltage is equal to or higher than 3 V.